(12) United States Patent
Son et al.

(10) Patent No.: US 10,147,942 B2
(45) Date of Patent: Dec. 4, 2018

(54) MULTI-LAYER STRUCTURED LITHIUM METAL ELECTRODE AND METHOD FOR MANUFACTURING SAME

(71) Applicant: LG CHEM, LTD., Seoul (KR)

(72) Inventors: Byoung Kuk Son, Daejeon (KR); Min Chul Jang, Daejeon (KR); Eun Kyung Park, Daejeon (KR); Doo Kyung Yang, Daejeon (KR); Jung Hun Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/507,641

(22) PCT Filed: Oct. 21, 2015

(86) PCT No.: PCT/KR2015/011145
§ 371 (c)(1),
(2) Date: Feb. 28, 2017

(87) PCT Pub. No.: WO2016/064187
PCT Pub. Date: Apr. 28, 2016

(65) Prior Publication Data
US 2017/0309899 A1 Oct. 26, 2017

(30) Foreign Application Priority Data

Oct. 23, 2014 (KR) .................. 10-2014-0144248
Oct. 20, 2015 (KR) .................. 10-2015-0145771

(51) Int. Cl.
*H01M 4/13* (2010.01)
*H01M 4/38* (2006.01)
(Continued)

(52) U.S. Cl.
CPC ............ *H01M 4/382* (2013.01); *C01D 15/00* (2013.01); *C23C 14/0036* (2013.01);
(Continued)

(58) Field of Classification Search
CPC .... H01M 4/382; H01M 4/134; H01M 4/1395; H01M 4/405; H01M 4/0428;
(Continued)

(56) References Cited

U.S. PATENT DOCUMENTS

| 5,314,765 A | 5/1994 | Bates |
| 2003/0142466 A1 | 7/2003 | Yamada et al. |

(Continued)

FOREIGN PATENT DOCUMENTS

| CN | 1432201 A | 7/2003 |
| CN | 103947027 A | 7/2014 |

(Continued)

OTHER PUBLICATIONS

International Search Report for PCT/KR2015/011145 (PCT/ISA/210) dated Feb. 11, 2016.
(Continued)

*Primary Examiner* — Jane J Rhee
(74) *Attorney, Agent, or Firm* — Birch, Stewart, Kolasch & Birch, LLP

(57) ABSTRACT

The present invention relates to a multi-layer structured lithium metal electrode and a method for manufacturing the same and, specifically, to a multi-layer structured lithium metal electrode comprising: a buffer layer of lithium nitride ($Li_3N$) formed on a lithium metal plate; and a protective layer of LiBON formed on the buffer layer, and to a method for manufacturing a multi-layer structured lithium metal electrode by continuously forming a lithium nitride buffer layer and a LiBON protective layer on a lithium metal plate through continuous reactive sputtering multi-layer structured lithium metal electrode multi-layer structured lithium metal electrode lithium metal plate multi-layer structured lithium metal electrode lithium metal plate. The multi-layer structured lithium metal electrode of the present invention
(Continued)

can protect the reactivity of the lithium metal from moisture or an environment within a battery, and prevent the formation of dendrites, by forming the protective layer.

14 Claims, 1 Drawing Sheet

(51) Int. Cl.
| | | |
|---|---|---|
| *H01M 4/134* | (2010.01) | |
| *H01M 4/1395* | (2010.01) | |
| *C01D 15/00* | (2006.01) | |
| *C23C 14/00* | (2006.01) | |
| *H01M 4/40* | (2006.01) | |
| *H01M 10/02* | (2006.01) | |
| *H01M 4/04* | (2006.01) | |
| *H01M 4/36* | (2006.01) | |
| *H01M 4/62* | (2006.01) | |
| *H01M 10/052* | (2010.01) | |
| *H01M 10/0562* | (2010.01) | |

(52) U.S. Cl.
CPC .......... *H01M 4/0428* (2013.01); *H01M 4/134* (2013.01); *H01M 4/1395* (2013.01); *H01M 4/366* (2013.01); *H01M 4/405* (2013.01); *H01M 4/628* (2013.01); *H01M 10/02* (2013.01); *H01M 10/052* (2013.01); *H01M 10/0562* (2013.01); *H01M 2300/0068* (2013.01)

(58) Field of Classification Search
CPC .... H01M 4/366; H01M 4/628; H01M 10/052; H01M 10/0562; H01M 2300/0068
See application file for complete search history.

(56) References Cited

U.S. PATENT DOCUMENTS

| | | |
|---|---|---|
| 2004/0209159 A1 | 10/2004 | Lee et al. |
| 2005/0003277 A1 | 1/2005 | Lee et al. |
| 2005/0084760 A1 | 4/2005 | Hwang et al. |
| 2005/0095504 A1 | 5/2005 | Kim et al. |
| 2007/0037058 A1 | 2/2007 | Visco et al. |
| 2008/0057387 A1 | 3/2008 | Visco et al. |
| 2011/0070503 A1 | 3/2011 | Nam et al. |
| 2013/0095380 A1 | 4/2013 | Affinito et al. |
| 2013/0216915 A1 | 8/2013 | Affinito et al. |
| 2014/0050976 A1 | 2/2014 | Nagai |

FOREIGN PATENT DOCUMENTS

| | | |
|---|---|---|
| JP | 2004-362983 A | 12/2004 |
| JP | 2005-26230 A | 1/2005 |
| JP | 2006-100083 A | 4/2006 |
| JP | 2009-505355 A | 2/2009 |
| JP | 4920880 B2 | 4/2012 |
| KR | 10-2003-0014263 A | 2/2003 |
| KR | 10-2003-0038549 A | 5/2003 |
| KR | 10-2004-0026370 A | 3/2004 |
| KR | 10-0542213 B1 | 1/2006 |
| KR | 10-2009-0121148 A | 11/2009 |
| KR | 10-2013-0043117 A | 4/2013 |
| KR | 10-2013-0106965 A | 10/2013 |
| KR | 10-2014-0083024 A | 7/2014 |
| WO | WO 01/97304 A1 | 12/2001 |

OTHER PUBLICATIONS

Y. Hamon et al., "Influence of sputtering conditions on ionic conductivity of LiPON thin films" Solid State Ionics, 2006, vol. 177, pp. 257-261.

Dussauze et al., "Lithium Ion Conducting Boron-Oxynitride Amorphous Thin Films: Synthesis and Molecular Structure by Infrared Spectroscopy and Density Functional Theory Modeling," J. Phys. Chem. C, Mar. 21, 2013, pp. 7202-7213.

Extended European Search Report for European Application No. 15852801.8, dated Dec. 5, 2017.

Japanese Office Action for Japanese Application No. 2017-501356, dated Dec. 19, 2017, with Machine Translation.

Kim et al., "Li—B—O—N Electrolytes for All-Solid-State Thin Film Batteries," Journal of Power Sources, vol. 189, 2009 (Published on web Oct. 2, 2008), pp. 211-216.

[Fig. 1]
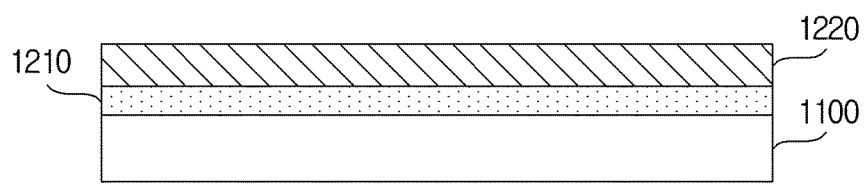
[Fig. 2]
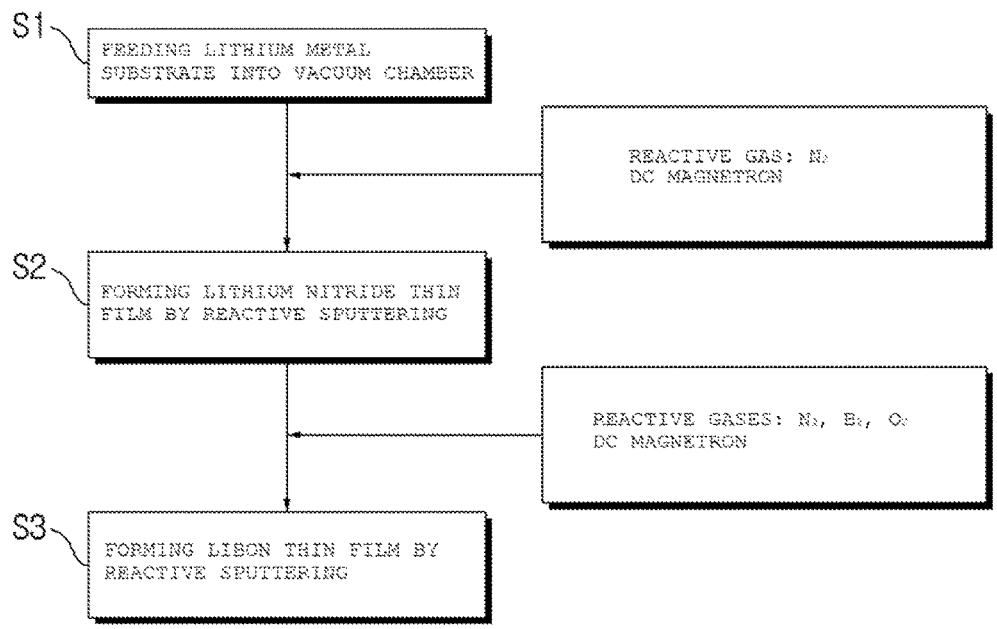

MULTI-LAYER STRUCTURED LITHIUM METAL ELECTRODE AND METHOD FOR MANUFACTURING SAME

TECHNICAL FIELD

The present invention relates to a multi-layer structured lithium metal electrode and a method for manufacturing the same and more particularly, to a multi-layer structured lithium metal electrode including a buffer layer including lithium nitride ($Li_3N$) formed on a lithium metal plate and a protective layer including LiBON formed on the buffer layer, and a method for manufacturing a multi-layer structured lithium metal electrode including continuously forming a lithium nitride buffer layer and a LiBON protective layer on a lithium metal plate by reactive sputtering.

BACKGROUND ART

A variety of devices requiring batteries such as cellular phones, wireless electronic equipment and electronic vehicles have been developed. This development of the devices has brought about an increase in demand for secondary batteries. In particular, in addition to the trend toward size reduction of electronic products, the weight and size of secondary batteries are being gradually reduced.

In response to this trend, recently, lithium metal secondary batteries (lithium metal batteries, LMB) receive much attention. A lithium metal secondary battery uses lithium for a negative electrode. Lithium has advantages of low density and low standard reduction potential of −3.04 V, thus being lightweight and imparting a high energy to secondary batteries produced therefrom.

Korean Patent Laid-open No. 2013-0043117 discloses lithium secondary batteries utilizing lithium metal oxides such as $LiNiCoMnO_2$, $LiNiO_2$, $LiCoO_2$, $LiMn_2O_4$, and $LiFePO_4$. In general, a secondary battery uses lithium oxide for a negative electrode. This is due to very excellent reactivity of lithium metal. Lithium metal reacts with moisture in the air to produce by-products such as LiOH, $Li_2O$ and $Li_2CO_3$. In addition, when a lithium metal used for an electrode is exposed to an electrolyte solution, resistance material is produced. This may significantly deteriorate performance of produced batteries and cause internal short circuit. In addition, disadvantageously, lithium is difficult to handle and be utilized as electrodes due to poor strength.

Thus, there is a need for development of electrodes that use a lithium metal to improve energy efficiency, solve the reactivity problem of lithium and simplify the production process.

PRIOR ART

Patent Document

Patent Document 1: Korean Patent Publication No. 2013-0043117 (publication date: Apr. 29, 2013)

DISCLOSURE

Technical Problem

Therefore, the present invention has been made in view of the above problems, and it is one object of the present invention to provide a multi-layer structured lithium metal electrode which comprises a protective layer for preventing vigorous reaction between moisture present in the air and lithium metal in the production of a cell to secure safety and a buffer layer for preventing a problem in which oxide formed by side-reaction between oxygen and lithium in the process of forming the protective layer causes a reduction of ionic conductivity.

It is another object of the present invention to provide a method of producing an electrode with excellent processability by forming sequentially and continuously a buffer layer and a protective layer on a lithium metal plate in one chamber by reactive sputtering.

Technical Solution

In accordance with the present invention, the above and other objects can be accomplished by the provision of a multi-layer structured lithium metal electrode comprising a buffer layer formed on a lithium metal plate and including lithium nitride ($Li_3N$), and a protective layer including LiBON having a composition represented by the following formula 1:

$$Li_xBO_yN_z \quad \text{[Formula 1]}$$

wherein x is 0.9 to 3.51, y is 0.6 to 3.2 and z is 0.5 to 1.0.

The buffer layer may be formed on one or both surfaces of the lithium metal plate, preferably, on a surface facing an electrolyte of the lithium metal plate.

In one embodiment, the LiBON having a composition represented by the Formula 1 may include any one selected from the group consisting of $Li_{3.09}BO_{2.53}N_{0.52}$, $Li_{0.90}BO_{0.66}N_{0.98}$, and $Li_{3.51}BO_{3.3}N_{0.52}$, but the present invention is not limited thereto.

In one embodiment, the lithium metal plate may have a thickness of 30 to 500 μm.

In one embodiment, the lithium nitride layer, as the buffer layer, may have a thickness of 0.01 to 5 μm.

In one embodiment, the LiBON layer, as the protective layer, may have a thickness of 0.1 to 10 μm.

In one embodiment, a method of forming the lithium nitride buffer layer or the LiBON protective layer is not particularly limited and the lithium nitride buffer layer or the LiBON protective layer may be formed by a method selected from electron beam evaporation, metal-organic chemical vapor deposition, reactive sputtering, high frequency sputtering and magnetron sputtering.

In another aspect of the present invention, provided is a method of producing a multi-layer structured lithium metal electrode by reactive sputtering, the method comprising feeding a lithium metal plate into a vacuum chamber, forming a lithium nitride ($Li_3N$) thin film on one or both surfaces of the lithium metal plate by reactive sputtering, and continuously forming a LiBON thin film having a composition represented by Formula 1 above on the lithium nitride thin film by reactive sputtering.

In another aspect of the present invention, provided is a lithium secondary battery comprising a negative electrode, a positive electrode, and an electrolyte interposed between the positive electrode and the negative electrode, wherein the multi-layer structured lithium metal electrode according to the present invention is used as the negative electrode.

Advantageous Effects

The multi-layer structured lithium metal electrode of the present invention can protect the reactivity of the lithium metal from moisture or an environment within a battery, and prevent the formation of dendrites, by forming the protective layer. In addition, the formation of the buffer layer prevents the deterioration of ion conductivity caused by an oxide layer formed on the lithium metal plate in the process of forming the protective layer.

DESCRIPTION OF DRAWINGS

FIG. 1 is a schematic diagram showing a multi-layer structured lithium metal electrode according to one embodiment of the present invention.

FIG. 2 is a flowchart showing a method of producing a multi-layer structured lithium metal electrode according to one embodiment of the present invention.

BEST MODE

Hereinafter, preferred embodiments of the present invention will be described in detail with respect to the annexed drawings. It should be noted that like elements are represented by same reference numbers as possible throughout the annexed drawings. In addition, detailed descriptions related to well-known functions or configurations that may obscure the subject matter of the present invention will be omitted. For the same reason, some elements are exaggerated, omitted or schematically illustrated in the accompanying drawings.

FIG. 1 is a schematic diagram showing a multi-layer structured lithium metal electrode according to one embodiment of the present invention.

Referring to FIG. 1, the lithium metal electrode 1000 of the present invention includes a buffer layer 1210 and a protective layer 1220 formed on a lithium metal plate 1100. As shown in the present drawing, the buffer layer 1210 and the protective layer 1220 are formed on only one surface of the lithium metal plate 1100. However, the layers 1210 and 1220 may be formed on both surfaces of the lithium metal plate 1100.

In general, lithium metal used for a negative electrode for batteries causes the following problems. First, lithium is an alkaline metal which explosively reacts with water and thus is difficult to produce and use under general environments. Second, when lithium is used for a negative electrode, it reacts with electrolyte or water, impurities in batteries, lithium salts and the like, to produce a passivation layer. This layer causes a local current density difference, thus creating dentrical lithium dendrites. In addition, the created dendrites may grow beyond pores of the separator and directly cause internal short circuit with the positive electrode, thus leading to battery explosion. Third, lithium is a soft metal, which has insufficient handling properties to be used without additional surface treatment due to weak mechanical strength.

Thus, the present invention can prevent formation of the passivation layer and dendrites, and reinforce mechanical strength by forming the buffer layer 1210 and the protective layer 1220. In addition, the buffer layer 1210 blocks reactivity of the lithium metal under battery production environments, thereby offering easy handling and preventing deterioration in ionic conductivity.

The lithium metal plate 1100 may be a plate-type metal. The width of the lithium metal plate can be controlled depending on the electrode shape so as to easily produce the electrode. The thickness of the lithium metal plate may be 30 to 500 μm.

The buffer layer 1210 includes lithium nitride ($Li_3N$) and may be formed on both upper and lower surfaces of the lithium metal plate 1100 or on only one surface facing the electrolyte layer. When the buffer layer 1210 is not formed, lithium metal is oxidized upon exposure to moisture in the air or the like in the process of forming the protective layer 1220, to produce $Li_2O$ which may cause deterioration in ionic conductivity. Thus, the lithium nitride thin film is formed in the present invention so as to prevent oxidation of the electrode, rather than improving battery performance. Accordingly, the lithium nitride layer is coated to a sufficient thickness to prevent oxidation of the surface of the lithium electrode upon exposure to moisture or air. When the lithium nitride layer is excessively thick, the thickness of the electrode is unnecessarily increased. Preferably, the thickness of the lithium nitride layer is 0.01 to 5 μm.

The protective layer 1220 is deposited on the buffer layer 1210 to prevent the lithium metal plate 1100 from being directly exposed to an electrolyte solution and thereby prevents reaction of lithium with the electrolyte. In addition, the protective layer 1220 of the present invention includes LiBON and thus exhibits conductivity, thereby facilitating transfer of ions to the electrode and improving battery lifespan and performance.

The LiBON may be represented by the following Formula 1:

$$Li_xBO_yN_z \qquad \text{[Formula 1]}$$

wherein x is 0.9 to 3.51, y is 0.6 to 3.2, and z is 0.5 to 1.0.

It is reported that, the LiBON of $Li_{3.09}BO_{2.53}N_{0.52}$ exhibits ionic conductivity of $2.3 \times 10^{-6}$ S/cm at maximum and thus better charge/discharge performance than conventional LiPON.

When the protective layer 1220 is excessively thin, it cannot sufficiently exert protecting effect from moisture or environments within the battery, and when the layer is excessively thick, capacity may be lost due to unnecessary thickness increase. Preferably, the thickness may be 0.1 to 10 μm.

Methods of forming the lithium nitride thin film of the buffer layer 1210 and the LiBON thin film of the protective layer 1220 are not particularly limited and may include, but are not limited to, a variety of deposition methods such as electron beam evaporation, metal-organic chemical vapor deposition, reactive sputtering, high frequency sputtering and magnetron sputtering. The exemplified deposition methods are well-known and a detailed explanation thereof is not given in the present disclosure.

The multi-layer structured lithium metal electrode 1000 according to the present invention may have a variety of widths and lengths depending on the shape of processed battery. The lithium metal electrode 1000 produced in various widths depending on the desired application may be wound and cut upon use, if necessary.

FIG. 2 shows a flowchart illustrating a method of producing a lithium electrode having a multilayer structure according to one embodiment of the present invention.

Referring to FIG. 2, first, a lithium metal plate is fed into a vacuum chamber (S1).

In the next step (S2), a lithium nitride ($Li_3N$) thin film is formed on one or both surfaces of the lithium metal plate by nitrogen ($N_2$) gas reactive sputtering.

In the next step (S3), while the lithium metal plate provided with the lithium nitride thin film is placed in the reaction chamber, a LiBON thin film including a composition represented by Formula 1 is continuously formed by reactive sputtering.

In this case, reactive sputtering is a method of forming a thin film using DC power. In accordance with this method, in order to form a lithium nitride thin film, a lithium metal is deposited as a target, an argon gas is injected to produce plasma, and nitrogen is fed as reactive gas. In addition, so as to form a LiBON thin film, boron gas, oxygen gas and nitrogen gas are fed as reactive gases in the same vacuum chamber, and the lithium metal plate, on which the lithium nitride thin film is coated, is used as a target. Each gas line is equipped with a mass flow controller (MFC) to control the gas. The amount of reacted gas should be accurately controlled so as to regulate the stoichiometric ratio of the thin film.

In one embodiment of the present invention, provided is a lithium secondary battery comprising a negative electrode, a positive electrode, and an electrolyte interposed between the positive electrode and the negative electrode, wherein the negative electrode is a lithium electrode having a multilayer structure. The secondary battery according to the present invention can exhibit higher capacity and higher energy density than conventional secondary batteries, because the negative electrode is produced using lithium metal, not lithium ions. In addition, it is possible to prevent reaction between lithium and moisture in the air and to form a protective layer on the lithium metal plate by forming the buffer layer on the lithium metal plate before production of the negative electrode.

MODE FOR THE INVENTION

Hereinafter, embodiments of the present invention will be described in more detail such that a person having ordinary knowledge in the field to which the present invention pertains can easily implement the embodiments. However, the embodiments of the present invention can be implemented in various forms and should not be construed as being limited to the embodiments described herein.

Example 1

A lithium nitride ($Li_3N$) thin film (thickness: 0.02 μm) was formed by reactive sputtering using exposure of 0.1 Pa of a nitrogen ($N_2$) gas to a lithium metal plate (thickness: 20 μm) for 5 minutes in a vacuum chamber and a LiBON thin film (thickness: 0.2 μm) including $Li_{3.09}BO_{2.53}N_{0.52}$ was continuously formed by reactive sputtering using $Li_2BO_3$ as a target while maintaining the lithium metal plate provided with the lithium nitride thin film in the reaction chamber. The lithium metal plate provided with the coating layer was used as a negative electrode.

An electrolyte solution was prepared by dissolving 1M lithium hexafluorophosphate ($LiPF_6$) in an organic solvent consisting of ethylene carbonate/dimethyl carbonate (EC/EMC=1/1, volume ratio).

A symmetric cell of the produced negative electrode was produced.

The surface of the LiBON thin film produced in Example 1 was observed using a scanning electron microscope (SEM) and results are shown in FIG. 3 of Korean Patent Application No. 10-2015-0145771 (filing date: Oct. 20, 2015) which is the original patent of the present invention.

Example 2

A symmetric cell was produced in the same manner as in Example 1, except that the lithium nitride ($Li_3N$) thin film was formed to have a thickness of 0.02 μm in Example 1.

Example 3

A symmetric cell was produced in the same manner as in Example 1, except that the lithium nitride ($Li_3N$) thin film was formed to have a thickness of 0.01 μm in Example 1.

Example 4

A symmetric cell was produced in the same manner as in Example 1, except that the LiBON thin film was formed to have a thickness of 0.01 μm in Example 1.

Example 5

A symmetric cell was produced in the same manner as in Example 1, except that the LiBON thin film was formed to have a thickness of 5 μm in Example 1.

Example 6

A symmetric cell was produced in the same manner as in Example 1, except that the LiBON thin film was formed so as to have a composition of $Li_{0.9}BO_{0.66}N_{0.98}$ in Example 1.

Example 7

A symmetric cell was produced in the same manner as in Example 1, except that the LiBON thin film was formed so as to a composition of $Li_{3.51}BO_{3.03}N_{0.52}$ in Example 1.

Comparative Example 1

A symmetric cell was produced in the same manner as in Example 1, except that the lithium nitride ($Li_3N$) thin film and the LiBON thin film were not formed.

Comparative Example 2

A symmetric cell was produced in the same manner as in Example 1, except that the LiBON thin film was not formed.

Comparative Example 3

A symmetric cell was produced in the same manner as in Example 1, except that the lithium nitride ($Li_3N$) thin film was not formed.

Comparative Example 4

A lithium nitride ($Li_3N$) thin film (thickness: 0.02 μm) was formed by reactive sputtering using exposure of 0.1 Pa of a nitrogen ($N_2$) gas to a lithium metal plate (thickness: 20 μm) for 5 minutes in a vacuum chamber and a LiPON thin film (thickness: 0.2 μm) including $LiPON_{1.33}$ was continuously formed by reactive sputtering using $Li_3PO_4$ as a target while maintaining the lithium metal plate provided with the lithium nitride thin film in the reaction chamber. The lithium metal plate provided with the coating layer was used as a negative electrode.

An electrolyte solution was prepared by dissolving 1M lithium hexafluorophosphate ($LiPF_6$) in an organic solvent consisting of ethylene carbonate/dimethyl carbonate (EC/EMC=1/1, volume ratio).

A symmetric cell of the produced negative electrode was produced.

The surface of the LiPON thin film produced in Example 4 was observed using a scanning electron microscope (SEM) and results are shown in FIG. 4 of Korean Patent Application No. 10-2015-0145771 (filing date: Oct. 20, 2015) which is the original patent of the present invention.

Comparative Example 5

A symmetric cell was produced in the same manner as in Comparative Example 4, except that the LiPON thin film was formed to have a thickness of 0.1 μm in Comparative Example 4.

Comparative Example 6

A symmetric cell was produced in the same manner as in Comparative Example 4, except that the LiPON thin film was formed to a thickness of 2 μm in Comparative Example 4.

Test Example: Measurement of Performance of Produced Symmetric Cell

The symmetric cells produced in Examples and Comparative Examples were charged/discharged at DOD (depth of discharge) of 83% under 1C charge/discharge conditions. After the charge/discharge, whether or not the Li metal was oxidized and whether or not the LiBON or LiPON thin film cracked were observed with the naked eye. Cycle efficiency (%) was measured and results are shown in the following Table 1.

TABLE 1

|  | Oxidization of Li metal | Crack of LiBON/LiPON thin film | Li cycle efficiency (%) |
| --- | --- | --- | --- |
| Example 1 | X | X | 91 |
| Example 2 | X | X | 81 |
| Example 3 | Δ | Δ | 69 |
| Example 4 | X | X | 73 |
| Example 5 | X | X | 75 |
| Example 6 | X | X | 89 |
| Example 7 | X | X | 87 |
| Comparative Example 1 | — | — | 68 |
| Comparative Example 2 | X | — | 70 |
| Comparative Example 3 | ○ | ○ | Impossible measurement |
| Comparative Example 4 | X | ○ | 69 |
| Comparative Example 5 | X | ○ | 68 |
| Comparative Example 6 | X | ○ | 71 |

1) Oxidization level of Li metal
X: no oxidization
Δ: partial oxidization
○: entire oxidization
2) Crack
X: no crack
Δ: intermittent crack
○: entire crack As can be seen from Table 1, in Examples 1 to 3, an optimal thickness of a lithium nitride ($Li_3N$) thin film is 0.02 μm. When the thickness is less than 0.02 μm, Li may be oxidized during coating of the LiBON thin film, and when the thickness is greater than 0.02 μm, Li efficiency is decreased due to resistance resulting from low ionic conductivity of the lithium nitride ($Li_3N$) thin film.

In addition, in Examples 1, 4 and 5, the optimal thickness of the LiBON thin film is 0.2 μm. When the thickness is less than 0.2 μm, breakage of the LiBON thin film during charge/discharge causes exposure of lithium to the electrolyte solution, thus resulting in efficiency deterioration and when the thickness is greater than 0.2 μm, efficiency is decreased due to resistance.

In addition, Examples 1, 6 and 7 exhibit an efficiency of about 90% although the efficiency may be slightly changed depending on the element composition of LiBON.

On the other hand, in Comparative Example 2, a LiBON thin film is not formed so that formation of lithium dendrites cannot be prevented and, in Comparative Example 3, a lithium nitride ($Li_3N$) thin film is not formed so that $LiO_2$ is formed during coating of the LiBON thin film and the battery cannot function.

In Comparative Examples 4 to 6, the LiPON thin film is formed instead of the LiBON thin film, but the surface of the LiPON thin film cracks, thus decreasing an efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention relates to a multi-layer structured lithium metal electrode and a method for manufacturing the same and, more particularly, to a multi-layer structured lithium metal electrode comprising a buffer layer of lithium nitride ($Li_3N$) formed on a lithium metal plate and a protective layer of LiBON formed on the buffer layer, and a method for manufacturing a multi-layer structured lithium metal electrode comprising continuously forming a lithium nitride buffer layer and a LiBON protective layer on a lithium metal plate by reactive sputtering. The lithium metal electrode may be used as a negative electrode for lithium secondary batteries.

The invention claimed is:
1. A multi-layer structured lithium metal electrode comprising:
   a lithium metal plate;
   a buffer layer formed on the lithium metal plate and including lithium nitride ($Li_3N$); and
   a protective layer formed on the buffer layer and including LiBON having a composition represented by the following Formula 1:

$$Li_xBO_yN_z \quad \text{[Formula 1]}$$

wherein x is 0.9 to 3.51, y is 0.6 to 3.2 and z is 0.5 to 1.0.
2. The multi-layer structured lithium metal electrode according to claim 1, wherein the buffer layer is formed on a surface facing an electrolyte of the lithium metal plate.
3. The multi-layer structured lithium metal electrode according to claim 1, wherein the LiBON having a composition represented by the Formula 1 is any one selected from the group consisting of $Li_{3.09}BO_{2.53}N_{0.52}$, $Li_{0.90}BO_{0.66}N_{0.98}$, and $Li_{3.51}BO_{3.03}N_{0.52}$.
4. The multi-layer structured lithium metal electrode according to claim 1, wherein the LiBON having a composition represented by the Formula 1 is $Li_{3.09}BO_{2.53}N_{0.52}$.
5. The multi-layer structured lithium metal electrode according to claim 1, wherein the lithium metal plate has a thickness of 30 to 500 μm.
6. The multi-layer structured lithium metal electrode according to claim 2, wherein the lithium metal plate has a thickness of 30 to 500 μm.

7. The multi-layer structured lithium metal electrode according to claim 1, wherein the lithium nitride layer, as the buffer layer, has a thickness of 0.01 to 5 μm.

8. The multi-layer structured lithium metal electrode according to claim 2, wherein the lithium nitride layer, as the buffer layer, has a thickness of 0.01 to 5 μm.

9. The multi-layer structured lithium metal electrode according to claim 1, wherein the LiBON layer, as the protective layer, has a thickness of 0.1 to 10 μm.

10. The multi-layer structured lithium metal electrode according to claim 2, wherein the LiBON layer, as the protective layer, has a thickness of 0.1 to 10 μm.

11. The multi-layer structured lithium metal electrode according to claim 1, wherein the lithium nitride buffer layer or the LiBON protective layer is formed by a method selected from electron beam evaporation, metal-organic chemical vapor deposition, reactive sputtering, high frequency sputtering and magnetron sputtering.

12. The multi-layer structured lithium metal electrode according to claim 1, wherein the multi-layer structured lithium metal electrode is a negative electrode for lithium secondary battery.

13. A method of producing a multi-layer structured lithium metal electrode comprising:
feeding a lithium metal plate into a vacuum chamber;
forming a lithium nitride ($Li_3N$) thin film on one or both surfaces of the lithium metal plate by nitrogen ($N_2$) gas reactive sputtering; and
continuously forming a LiBON thin film having a composition represented by the following Formula 1 on the lithium nitride thin film by nitrogen ($N_2$) gas reactive sputtering:

$$Li_xBO_yN_z \qquad \text{[Formula 1]}$$

wherein x is 0.9 to 3.51, y is 0.6 to 3.2 and z is 0.5 to 1.0.

14. A lithium secondary battery comprising:
a negative electrode;
a positive electrode; and
an electrolyte interposed between the positive electrode and the negative electrode,
wherein the negative electrode is the multi-layer structured lithium metal electrode according to claim 1.

* * * * *